(12) United States Patent
Okumura et al.

(10) Patent No.: US 7,928,583 B2
(45) Date of Patent: Apr. 19, 2011

(54) SEMICONDUCTOR DEVICE

(75) Inventors: Hiroshi Okumura, Kyoto (JP); Shingo Higuchi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 300 days.

(21) Appl. No.: 12/339,218

(22) Filed: Dec. 19, 2008

(65) Prior Publication Data
US 2009/0160063 A1    Jun. 25, 2009

(30) Foreign Application Priority Data
Dec. 21, 2007 (JP) .................. 2007-329505

(51) Int. Cl.
*H01L 23/48* (2006.01)
*H01L 23/52* (2006.01)
*H01L 29/40* (2006.01)

(52) U.S. Cl. . 257/778; 257/737; 257/738; 257/E23.021; 257/E23.069

(58) Field of Classification Search ............. 257/737, 257/738, 731, 778, 773, 733, 779, 781, 782, 257/783, 786, E23.02, E23.021, E23.069, E21.508, E23.015
See application file for complete search history.

(56) References Cited

U.S. PATENT DOCUMENTS
| 2004/0082101 A1* | 4/2004 | Honda ........................ 438/106 |
| 2005/0146030 A1* | 7/2005 | Miyazaki ..................... 257/738 |
| 2007/0075423 A1* | 4/2007 | Ke et al. ...................... 257/737 |

FOREIGN PATENT DOCUMENTS
JP    2004-161886    6/2004

* cited by examiner

*Primary Examiner* — A. Sefer
*Assistant Examiner* — Dilinh P Nguyen
(74) *Attorney, Agent, or Firm* — Fish & Richardson P.C.

(57) ABSTRACT

A semiconductor device includes a semiconductor substrate; a sealing resin layer formed on a top face of the semiconductor substrate; a metal post formed on the top face of the semiconductor substrate such that a top face of the metal post is exposed through the sealing resin layer; a projecting electrode formed on the top face of the metal post; and a low-elasticity resin layer made of a resin material with an elasticity modulus lower than that of the sealing resin layer and formed on the top face of the sealing resin layer such that part of the low-elasticity resin layer lies between the projecting electrode and the sealing resin layer.

5 Claims, 12 Drawing Sheets

SEMICONDUCTOR DEVICE

This application is based on Japanese Patent Application No. 2007-329505 filed on Dec. 21, 2007, the contents of which are hereby incorporated by reference.

BACKGROUND OF THE INVENTION

1. Field of the Invention

The present invention relates to semiconductor devices, and in particular to a semiconductor device provided with a projecting electrode.

2. Description of Related Art

In recent years, there has been a strong demand for a further downsizing of semiconductor devices, and accordingly various measures have been taken on packages incorporating semiconductor chips. And a further downsizing of semiconductor devices has become possible by adopting a package structure in which external terminals of wiring for a semiconductor chip are arranged on the bottom face of the package and spherical solder pieces are fitted to ends of the wiring to serve as electrodes. For example, as disclosed in Japanese Unexamined Patent Application Publication No. 2004-161886, WLCSP (Wafer Level Chip Size Package) type semiconductor devices with packages about the same size as semiconductor chips have been put to practical use.

FIG. 10 is a perspective view illustrating the structure of a conventional WLCSP type semiconductor device. FIG. 11 is a sectional view illustrating the structure of the conventional WLCSP type semiconductor device. As shown in FIGS. 10 and 11, the WLCSP type semiconductor device 100 has a semiconductor substrate (semiconductor chip) 111 that has an integrated circuit portion (not illustrated) formed on the top face (one surface) thereof, electrode pads 112 formed on the top face of the semiconductor substrate 111, a sealing resin layer 113 formed on the top face of the semiconductor substrate 111, column-shaped metal posts 114 provided on the top face of the electrode pad 112 with the top faces of the metal posts 114 exposed through the sealing resin layer 113, and solder balls (projecting electrodes) 115 formed on the top faces of the metal posts.

In this way, with the WLCSP type semiconductor device 100, it is possible to reduce the package size to the size of the semiconductor substrate (semiconductor chip) 111 by providing the solder balls 115 which serve as external terminals on the top faces of the metal posts 114, while protecting the top surface of the semiconductor substrate (semiconductor chip) ill with the sealing resin layer 113. Structured as described above, the WLCSP type semiconductor device 100 is directly mounted on an external board such as a printed circuit board 119.

FIG. 12 is a sectional view illustrating the structure of the WLCSP type semiconductor device mounted on a printed circuit board. While the semiconductor device 100 is mounted on the printed circuit board 119 by connecting together the solder balls 115 and conductive bumps 118 provided on the printed circuit board 119 such as a glass/epoxy board, the semiconductor device 100 and the printed circuit board 119 are electrically connected together via the solder balls 115 and the conductive bumps 118.

After mounting a semiconductor device with a package structure similar to that of the WLCSP type semiconductor device 100 described above on a printed circuit board 119, thermal expansion or thermal contraction may arise in the semiconductor substrate 111 and the printed circuit board 119 as a result of temperature change or the like. In this case, the deformation force resulting from a difference in the degree of thermal expansion or a difference in the degree of thermal contraction between the printed circuit board 119 and the semiconductor substrate 111 acts in a concentrated fashion on the solder balls 115 as projecting electrodes. For this reason, damage or breakage such as cracks 125 may develop in the solder balls 115 (in particular to the base part of the solder balls 115 where the solder balls 115 and the sealing resin layer 113 are in contact with or close to each other).

SUMMARY OF THE INVENTION

The present invention has been devised to solve the above problems, and it is an object of the invention to provide a semiconductor device that can prevent damage, such as cracking, to or breakage of a solder ball (projecting electrode) by reducing or canceling the deformation force acting in a concentrated fashion on the solder ball.

To achieve the above object, a semiconductor device according to the invention includes a semiconductor substrate, a sealing resin layer formed on a top face of the semiconductor substrate, a metal post formed on the top face of the semiconductor substrate such that a top face of the metal post is exposed through the sealing resin layer, a projecting electrode formed on the top face of the metal post, a low-elasticity resin layer that is made of a resin material with a low elastic modulus than that of the sealing resin layer and that is formed on a top face of the sealing resin layer such that at least part of the low-elasticity resin layer lies between the projecting electrode and the sealing resin layer.

With this structure, after the semiconductor device according to the invention is mounted on an external board such as a printed circuit board, if a difference in the degree of thermal expansion or a difference in the degree of thermal contraction arises between the semiconductor substrate and the external board as a result of temperature change or the like, the low-elasticity resin layer lying between the projecting electrode and the sealing resin layer can reduce and cancel the deformation force acting on the projecting electrode (in particular to the part thereof where the projecting electrode and the sealing resin layer are in contact with or close to each other). Thus, it is possible to prevent damage to or breakage of the projecting electrode.

The low-elasticity resin layer may be formed in a circumferential part of the metal post as seen in a plan view.

The low-elasticity resin layer may be formed to cover the whole top face of the sealing resin layer.

The low-elasticity resin layer may be formed of polyimide, and the projecting electrode may be formed of solder.

DETAILED DESCRIPTION OF PREFERRED EMBODIMENTS

With reference to the accompanying drawings, embodiments of the present invention will be described in detail below.

The First Embodiment

Figure 1:
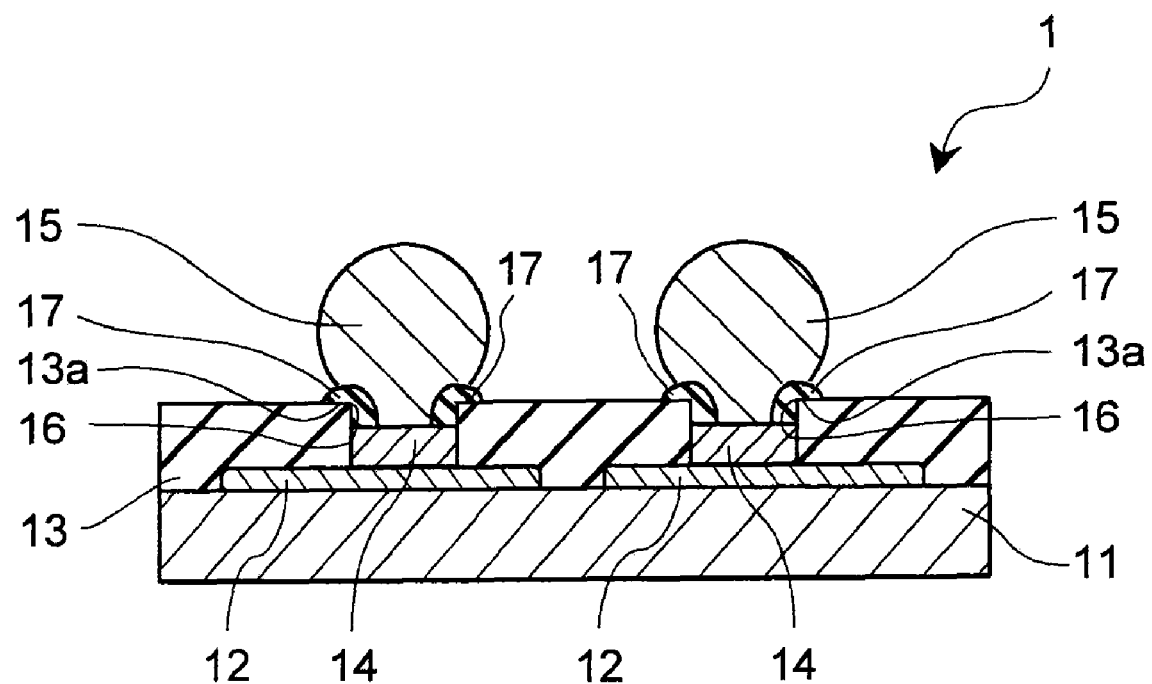
FIG. 1 is a sectional view illustrating the structure of a semiconductor device according to a first embodiment of the invention.
Figure 2:
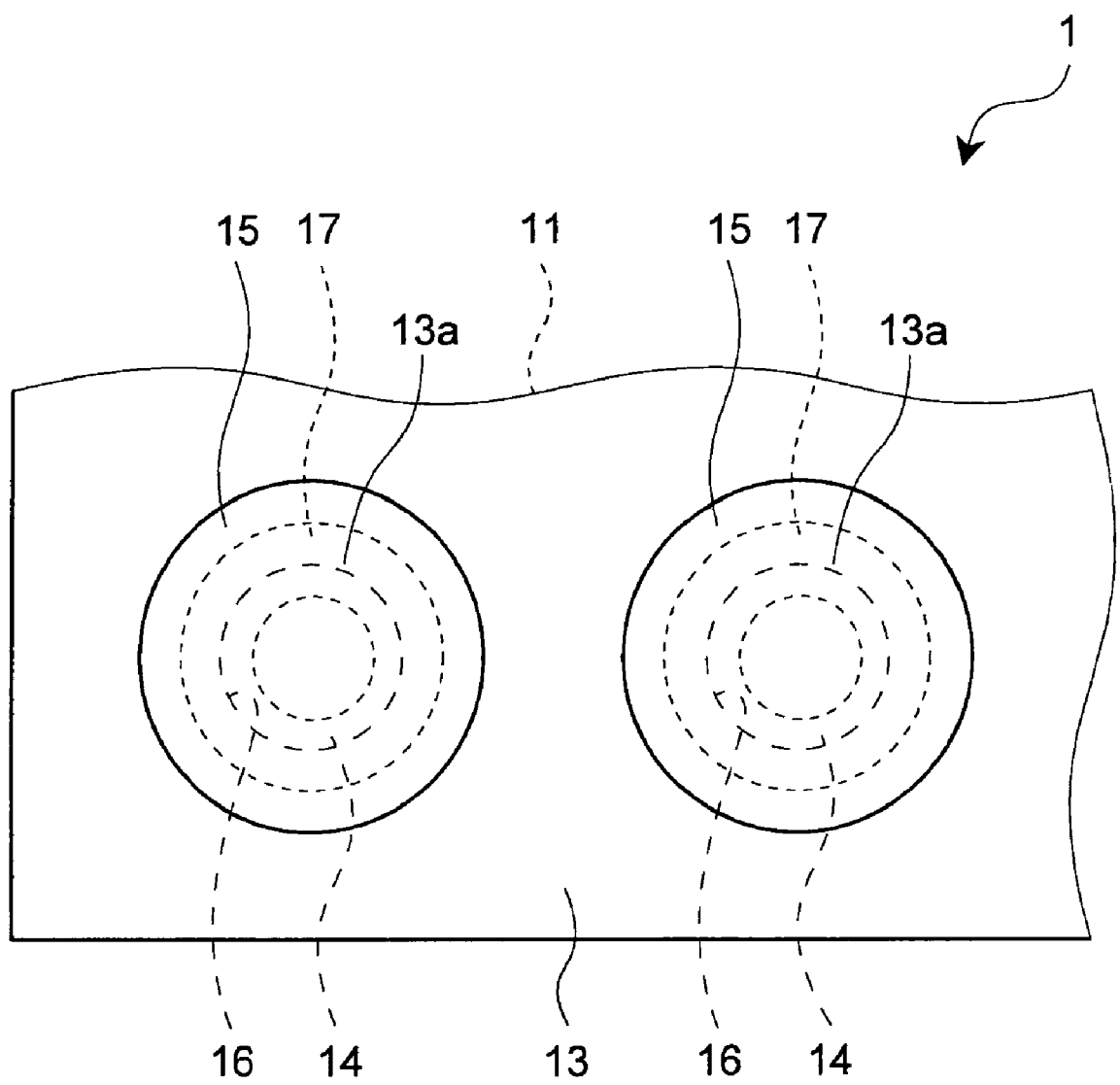
FIG. 2 is a plan view of the semiconductor device according to the first embodiment of the invention.

FIG. 1 is a sectional view illustrating the structure of a semiconductor device according to a first embodiment of the invention. FIG. 2 is a plan view of the semiconductor device according to the first embodiment of the invention. As shown in FIG. 1, the semiconductor device 1 according to the first embodiment of the invention has a silicon substrate 11 that has an integrated circuit portion (not shown) on the top face (one surface) thereof, electrode pads 12 formed on the top face of the silicon substrate 11, a sealing resin layer 13 formed on the top face of the silicon substrate 11, column-shaped metal posts 14 provided on the top faces of the electrode pads 12 with the top faces of the metal posts exposed through the sealing resin layer 13, solder balls 15 formed on the top faces of the metal posts 14, and a low-elasticity resin layer 17 formed on the top face of the sealing resin layer 13 such that part of the low-elasticity resin layer 17 lies between the sealing resin layer 13 and the solder balls 15. Note that the silicon substrate 11 is one example of a "semiconductor substrate" according to the invention, and the solder ball 15 is one example of a "projecting electrode" according to the invention.

The silicon substrate 11 has an integrated circuit portion (not shown) and a wiring portion (not shown) on the top face (one surface) thereof.

The electrode pads 12 are part of the wiring portion formed on the top face of the silicon substrate 11, and are formed of Cu in this embodiment. The metal posts 14 are provided on the electrode pads 12.

The sealing resin layer 13 is electrically insulating; it covers the surface of the silicon substrate 11 and the electrode pads 12, and also has the function of protecting the surfaces of the silicon substrate 11 and the electrode pads 12 against external influence. In this embodiment, an epoxy composite material which is a composite material of ceramic powder and epoxy resin is used as the sealing resin layer 13. On the surface of the sealing resin layer, corners 16 are formed in the vicinity of the solder balls 15. Circumferential parts 13a of the sealing resin layer 13 abutting the metal posts 14 are covered by the low-elasticity resin layer 17.

The metal posts 14 are provided on the top face of the silicon substrate 11, and are electrically connected to the wiring portion via the electrode pads 12. The metal posts 14 are formed of Cu. The top faces of the metal posts 14 are exposed through the top face of the sealing resin layer 13, and the top faces of the metal posts 14 are lower than the top face of the sealing resin layer 13. In this embodiment, the top faces of the metal posts 14 are lower than the top face of the sealing resin layer 13 for about 3 μm.

The solder balls 15 are provided on the top face of the metal posts 14 exposed through the sealing resin layer 13 in, for example, an environment with a low or substantially no partial oxygen pressure, and serves as projecting electrodes. Note that although the corners 16 and the solder balls 15 are close to each other, the corners 16 and the solder balls 15 are not in direct contact with each other since the low-elasticity resin layer 17 is formed to lie between the corners 16 and the solder balls 15.

The low-elasticity resin layer 17 is formed to cover the corners 16 on the surface of the sealing resin layer 13. The material of the low-elasticity resin layer 17 is a resin material with a lower elastic modulus than that of the sealing resin layer 13, and polyimide is used in this embodiment. As shown in FIG. 2, in the first embodiment of the invention, the low-elasticity resin layer 17 is formed in a circumferential part of the metal posts 14, and is formed to cover the whole of the corners 16 as seen in a plan view. The low-elasticity resin layer 17 covers the circumferential parts 13a at the top face of the sealing resin layer 13 over a width of about 3 μm from the corners 16, and covers the top face of the metal posts over a width of about 3 μm from the circumference thereof.

Figure 3:
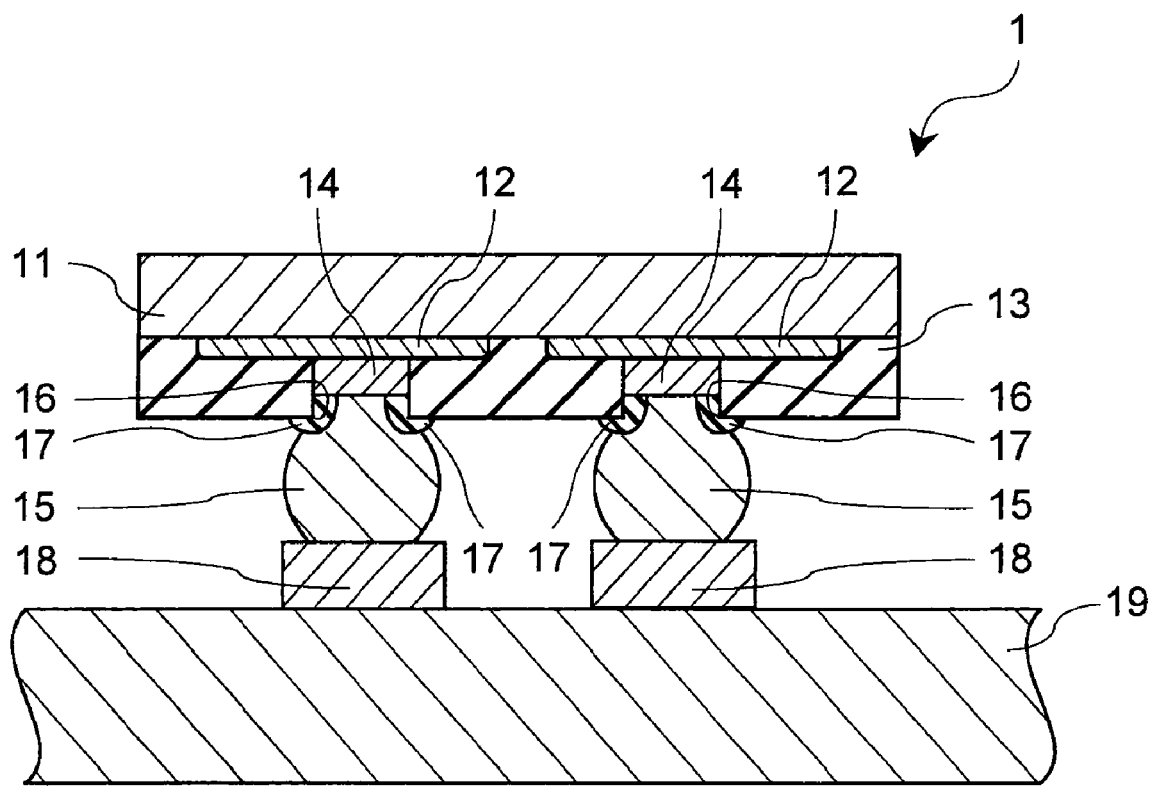
FIG. 3 is a sectional view illustrating a state of the semiconductor device according to the first embodiment of the invention mounted on a printed circuit board.

FIG. 3 is a sectional view illustrating a state of the semiconductor device according to the first embodiment of the invention mounted on a printed circuit board. The semiconductor device 1 according to the first embodiment of the invention is mounted on a printed circuit board 19 by connecting together the solder balls 15 provided on the semiconductor device 1 and conducting bumps 18 provided on the printed circuit board 19, and the electrode pads 12 and the conducting bumps 18 are electrically connected together via the metal posts 14 and the solder balls 15.

In FIG. 3, for example, if a difference in the degree of thermal expansion or a difference in the degree of thermal contraction arises between the silicon substrate 11 and the printed circuit board 19 as a result of temperature change, and a deformation force acts in a concentrated fashion on the solder ball 15 (in particular to the base part of the solder ball 15 where it is close to the corner 16), the deformation force acting in a concentrated fashion on the solder ball 15 can be reduced or canceled with the low-elasticity resin layer 17 lying between the solder ball 15 and the corner 16. Thus, it is possible to prevent damage, such as cracking, to or breakage of the solder ball 15.

In the first embodiment, the silicon substrate 11 exemplifies a semiconductor substrate, the sealing resin layer 13 is formed of an epoxy composite material, the metal post 14 is formed of Cu, the solder ball 15 exemplifies a projecting electrode, and the low-elasticity resin layer 17 is formed of polyimide. It is however to be understood that these specific examples adopted in this embodiment are not meant to limit the structure of a semiconductor device according to the present invention, in which many variations and modifications are therefore possible.

The low-elasticity resin layer 17 may be formed not to cover the top face of the metal post 14, so long as it covers the corner 16. Also, even if the low-elasticity resin layer 17 is formed to cover at least part of the corner 16, the deformation force acting in a concentrated fashion on the solder ball 15 can be reduced or canceled with the low-elasticity resin layer 17, and it is possible to prevent damage, such as cracking, to or breakage of the solder ball 15.

Figure 4:
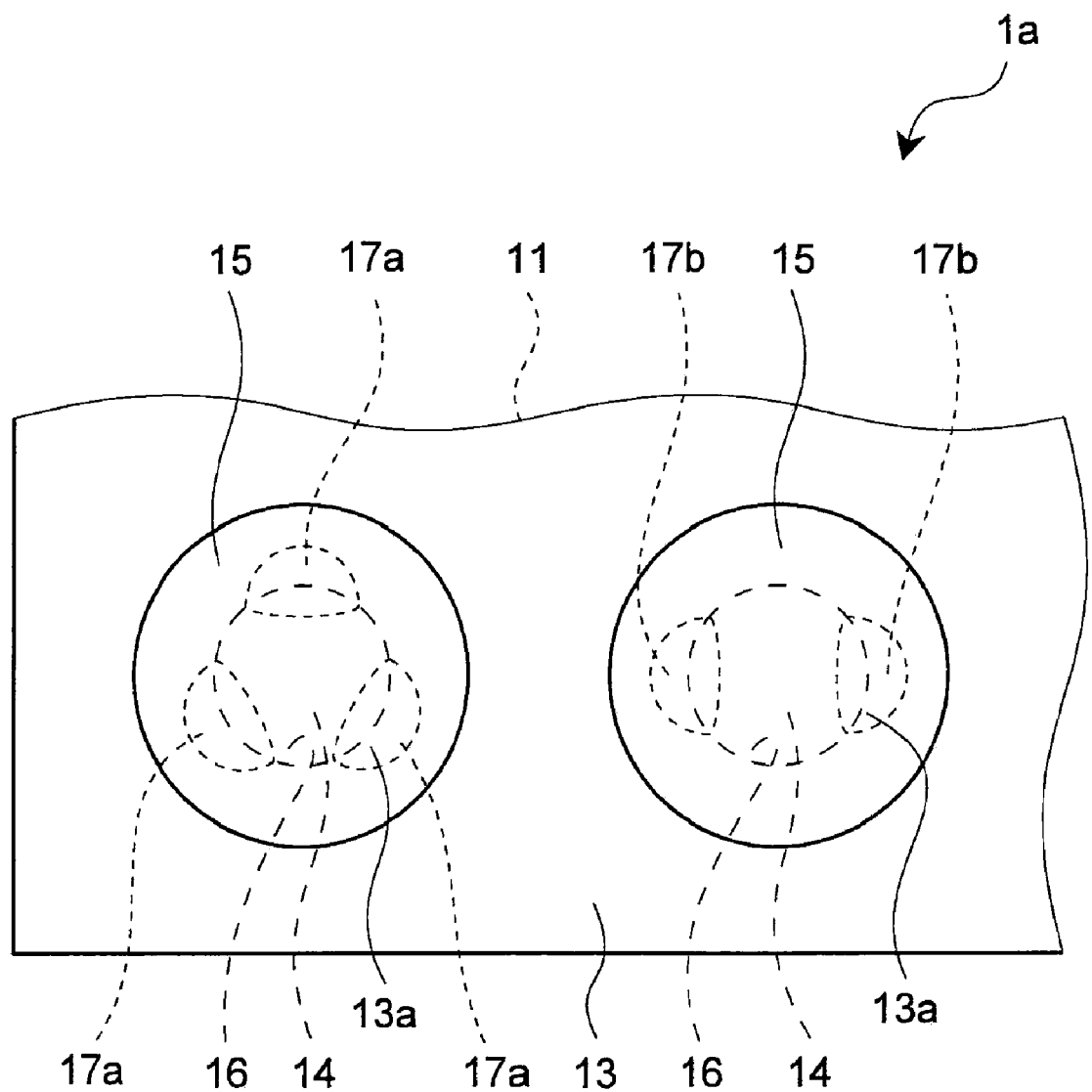
FIG. 4. is a plan view illustrating the structure of a semiconductor device of a modified example of the first embodiment.

FIG. 4 is a plan view illustrating the structure of a semiconductor device of a modified example of the first embodiment. As shown in FIG. 4, in a plan view, the low-elasticity resin layer 17*a* covers three parts of the corner 16, and the low-elasticity resin layer 17*b* covers two parts of the corner 16. Even with this structure, where the low-elasticity resin layer 17*a* and 17*b* covers at least part of the corner 16, the deformation force acting on the solder ball 15 can be reduced or canceled with the low-elasticity resin layer 17*a* and 17*b*. The low-elasticity resin layer 17*a* and 17*b* may be formed not to cover the top face of the metal post 14.

The low-elasticity resin layer 17 (17*a*, 17*b*) may even be formed to cover the whole top face of the sealing resin layer 13 including the corner 16.

The Second Embodiment

Figure 5:
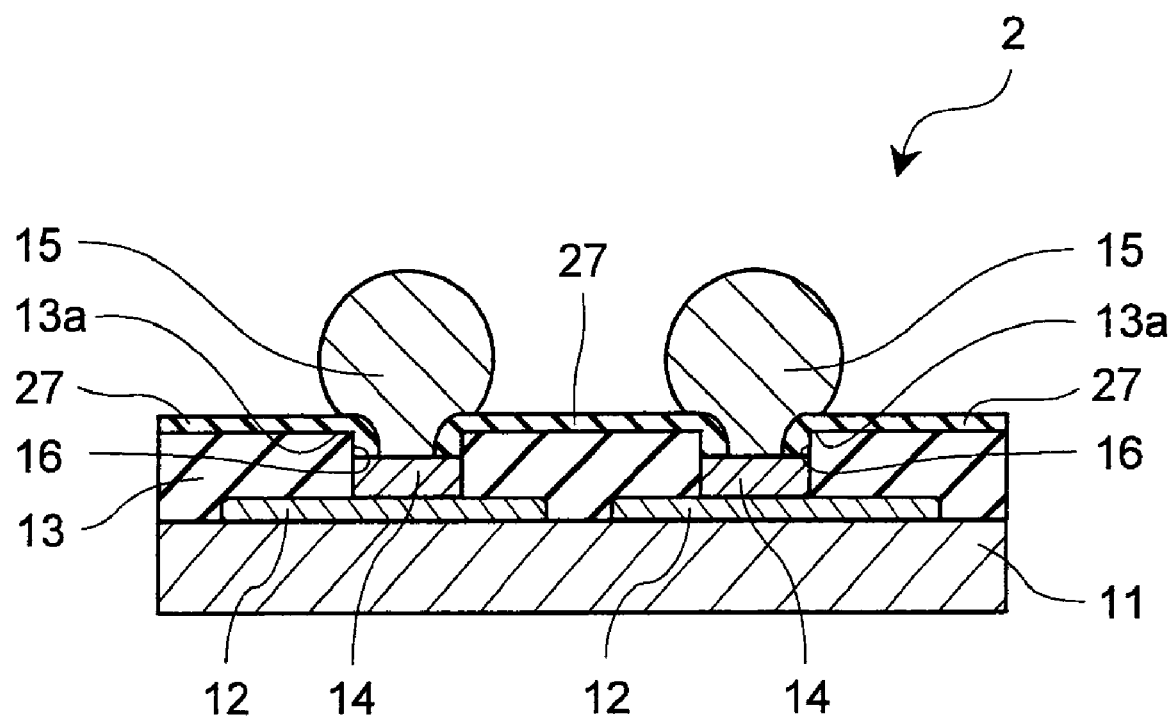
FIG. 5 is a sectional view illustrating the structure of a semiconductor device according to a second embodiment of the invention.

FIG. 5 is a sectional view illustrating the structure of a semiconductor device according to a second embodiment of the invention. The semiconductor device 2 according to the second embodiment of the invention has a silicon substrate 11 that has an integrated circuit portion (not shown) on the top face (one surface) thereof, electrode pads 12 formed on the top face of the silicon substrate 11, a sealing resin layer 13 formed on the top face of the silicon substrate 11, metal posts 14 provided on the top faces of the electrode pads 12 with the top faces of the metal posts exposed through the sealing resin layer 13, solder balls 15 formed on the top faces of the metal posts 14, and a low-elasticity resin layer 27 formed on the top face of the sealing resin layer 13 such that part of the low-elasticity resin layer 27 lies between the sealing resin layer 13 and the solder balls 15.

The second embodiment of the invention is a modified example of the first embodiment, and the low-elasticity resin layer 27 is formed to cover the whole top face of the sealing resin layer 13. In other respects, the structure here is similar to that in the first embodiment. The low-elasticity resin layer 27 may be formed not to cover the top faces of the metal posts 14, so long as it covers the top face of the sealing resin layer 13 including at least part of the corners 16.

Also with the structure shown in FIG. 5, the deformation force acting in a concentrated fashion on the solder ball 15 (in particular to the base part of the solder ball 15 where it is close to the sealing resin layer 13), resulting from temperature change or the like, can be reduced or canceled with the low-elasticity resin layer 27, and accordingly it is possible to prevent damage, such as cracking, to or breakage of the solder ball 15.

Also in a case where the top face of the metal post is flush with the top face of the sealing resin layer 13, the deformation force acting on the solder ball can be reduced or canceled.

The Third Embodiment

Figure 6:
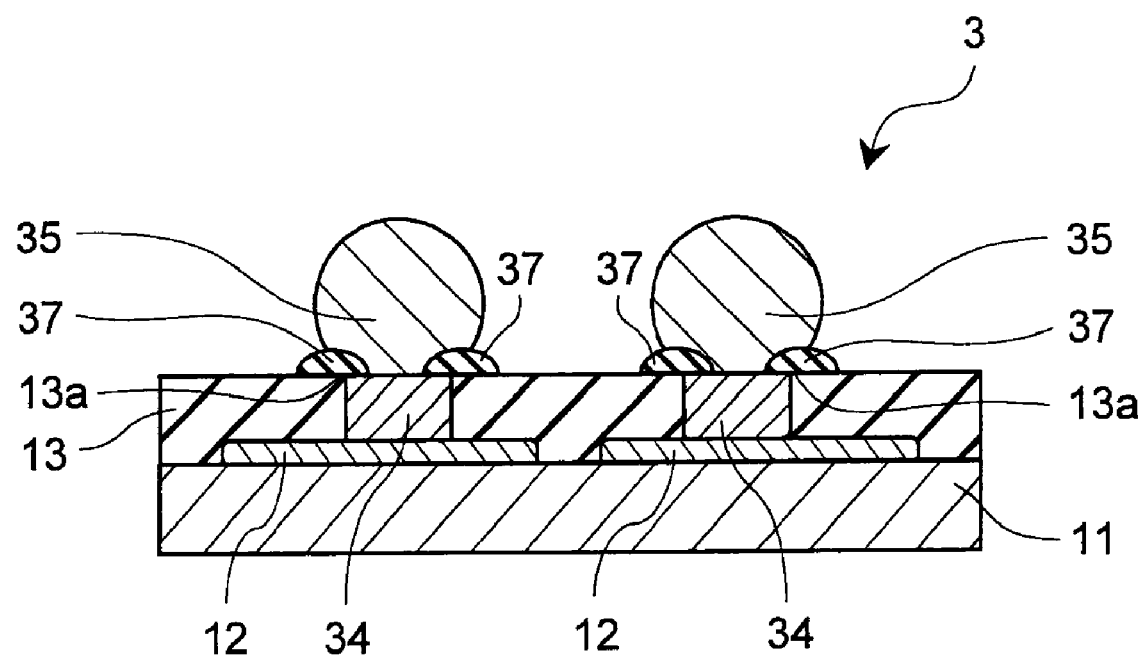
FIG. 6 is a sectional view illustrating the structure of a semiconductor device according to a third embodiment of the invention.

FIG. 6 is a sectional view illustrating the structure of a semiconductor device according to a third embodiment of the invention. The semiconductor device 3 according to the third embodiment of the invention has a silicon substrate 11 that has an integrated circuit portion (not shown) on the top face (one surface) thereof, electrode pads 12 formed on the top face of the silicon substrate 11, a sealing resin layer 13 formed on the top face of the silicon substrate 11, column-shaped metal posts 34 provided on the top faces of the electrode pads 12 with the top faces of the metal posts exposed through the sealing resin layer 13, solder balls 35 formed on the top faces of the metal posts 34, and a low-elasticity resin layer 37 formed such that part of it lies between the sealing resin layer 13 and the solder balls 35.

As shown in FIG. 6, the top faces of the metal posts 34 are flush with the top face of the sealing resin layer 13, and accordingly no corner is formed on the surface of the sealing resin layer 13; thus the low-elasticity resin layer 37 is provided to cover the circumferential parts 13*a* of the sealing resin layer 13 abutting the metal posts 34. In other respects, the structure here is similar to that in the first embodiment. Note that so long as the low-elasticity resin layer 37 is formed to cover at least part of the circumferential part 13*a* of the sealing resin layer 13 abutting the metal post 34, the deformation force acting on the solder ball 15 can be reduced or canceled with the low-elasticity resin layer 37. Moreover, the low-elasticity resin layer 37 may be formed not to cover the top face of the metal post 34.

Furthermore, the low-elasticity resin layer 37 may be formed to cover the whole top face of the sealing resin layer 13.

The Fourth Embodiment

Figure 7:
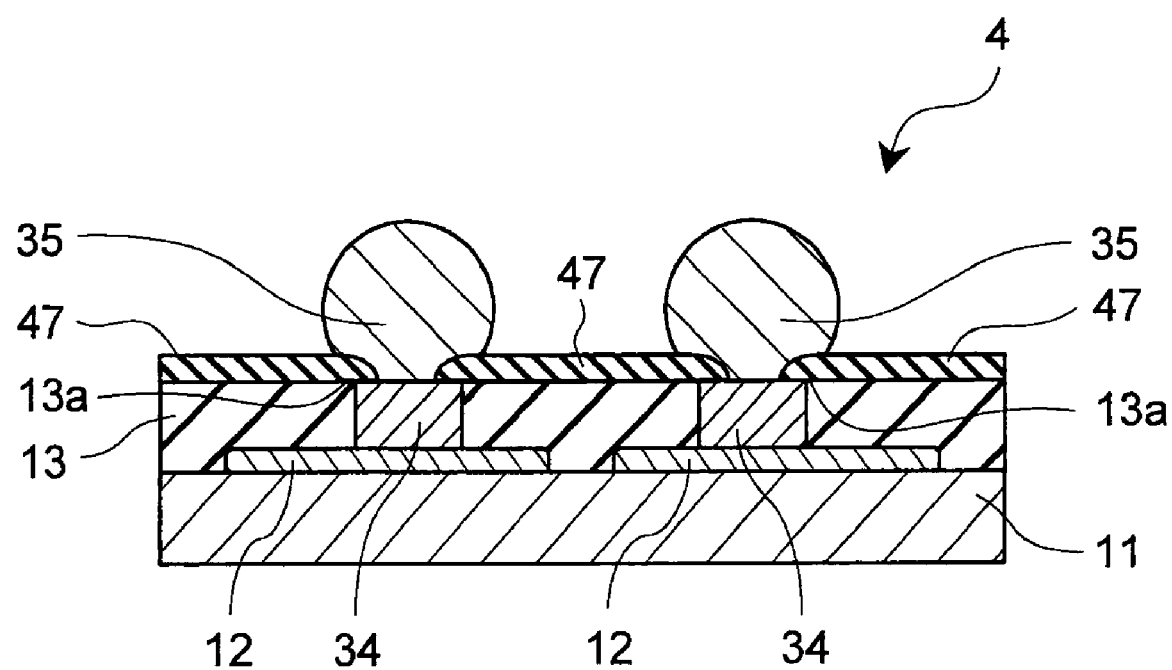
FIG. 7 is a sectional view illustrating the structure of a semiconductor device according to a fourth embodiment of the invention.

FIG. 7 is a sectional view illustrating the structure of a semiconductor device according to a fourth embodiment of the invention. The semiconductor device 4 according to the fourth embodiment of the invention has a silicon substrate 11 that has an integrated circuit portion (not shown) on the top face (one surface) thereof, electrode pads 12 formed on the top face of the silicon substrate 11, a sealing resin layer 13 formed on the top face of the silicon substrate 11, column-shaped metal posts 34 provided on the top faces of the electrode pads 12 with the top faces of the metal posts exposed through the sealing resin layer 13, solder balls 35 formed on the top faces of the metal posts 34, and a low-elasticity resin layer 47 formed such that part of it lies between the sealing resin layer 13 and the solder balls 35.

The fourth embodiment is a modified example of the third embodiment, and the low-elasticity resin layer 47 is formed to cover the whole top face of the sealing resin layer 13. In other respects, the structure here is similar to that in the third embodiment. Note that the low-elasticity resin layer 47 may be formed not to cover the top face of the metal post 34 so long as the low-elasticity resin layer 47 is formed to cover at least part of the circumferential part 13*a* of the sealing resin layer 13 abutting the metal post 34.

Also with the structure shown in FIG. 7, the deformation force acting in a concentrated fashion on the solder ball 35 (in particular to the base part of the solder ball 35 where it is close to the sealing resin layer 13), resulting from temperature change or the like, can be reduced or canceled with the low-elasticity resin layer 47, and accordingly it is possible to prevent damage, such as cracking, to or breakage of the solder ball 35.

Also, even with a structure where the metal post is formed such that the top face of it projects above the top face of the sealing resin layer 13, the deformation force acting on the solder ball can be reduced or canceled with the low-elasticity resin layer.

The Fifth Embodiment

Figure 8:
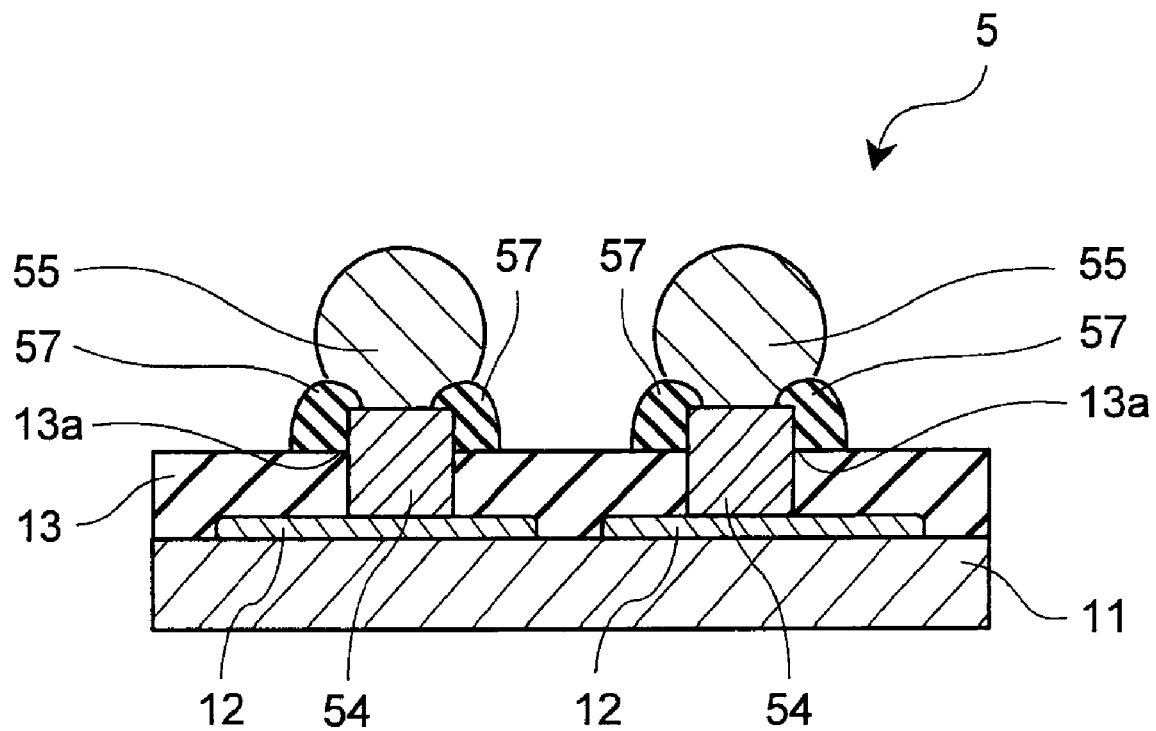
FIG. 8 is a sectional view illustrating the structure of the semiconductor device according to a fifth embodiment of the invention.

FIG. 8 is a sectional view illustrating the structure of a semiconductor device according to a fifth embodiment of the invention. The semiconductor device 5 according to the fifth embodiment of the invention has a silicon substrate 11 that has an integrated circuit portion (not shown) on the top face (one surface) thereof, electrode pads 12 formed on the top face of the silicon substrate 11, a sealing resin layer 13 formed on the top face of the silicon substrate 11, column-shaped metal posts 54 provided on the top faces of the electrode pads 12 with the top faces of the metal posts exposed through the sealing resin layer 13, solder balls 55 formed on the top faces of the metal posts 54, and a low-elasticity resin layer 57 formed such that part of it lies between the sealing resin layer 13 and the solder balls 55.

As shown in FIG. 8, the top faces of the metal posts 54 project out from the top face of the sealing resin layer 13, and accordingly the low-elasticity resin layer 57 covers the circumferential parts 13a of the sealing resin layer 13 abutting the metal posts 54. In other respects, the structure here is similar to that in the first embodiment. Note that so long as the low-elasticity resin layer 57 is formed to cover at least part of the circumferential part 13a of the sealing resin layer 13 abutting the metal post 54, the deformation force acting on the solder ball 55 can be reduced or canceled with the low-elasticity resin layer 57. The low-elasticity resin layer 57 may be formed not to cover the surface of the metal post 54.

The low-elasticity resin layer 57 may instead be formed to cover the whole top face of the sealing resin layer 13.

The Sixth Embodiment

Figure 9:
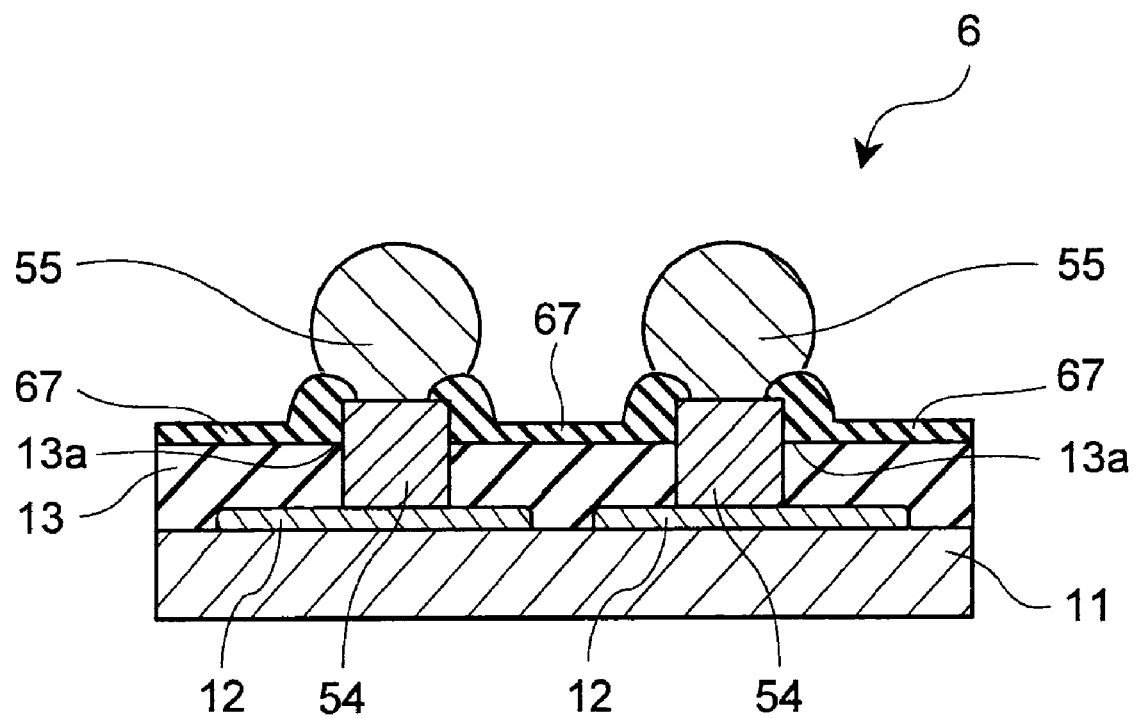
FIG. 9 is a sectional view illustrating the structure of the semiconductor device according to a sixth embodiment of the invention.
Figure 10:
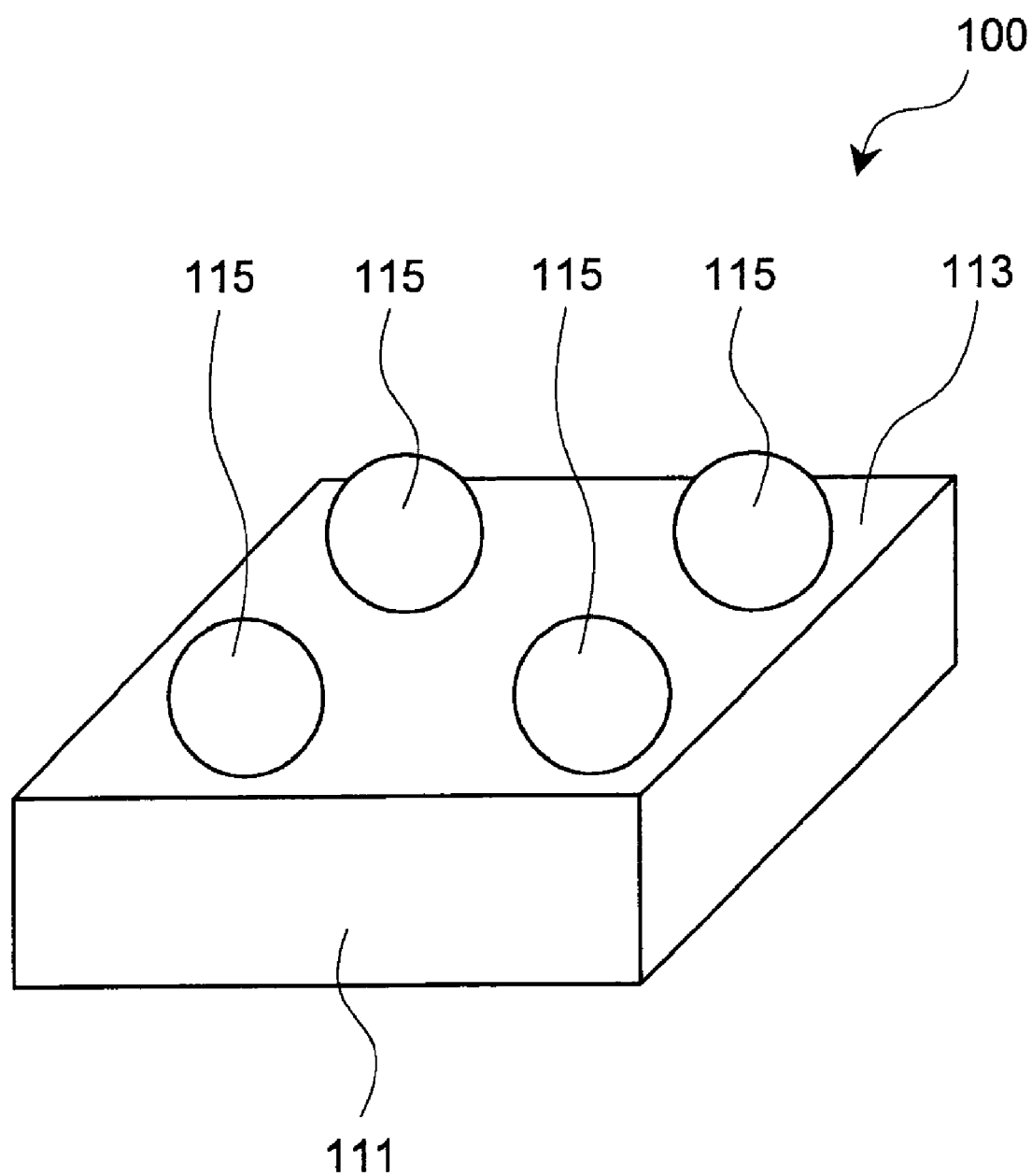
FIG. 10 is a perspective view illustrating the structure of a conventional WLCSP type semiconductor device.
Figure 11:
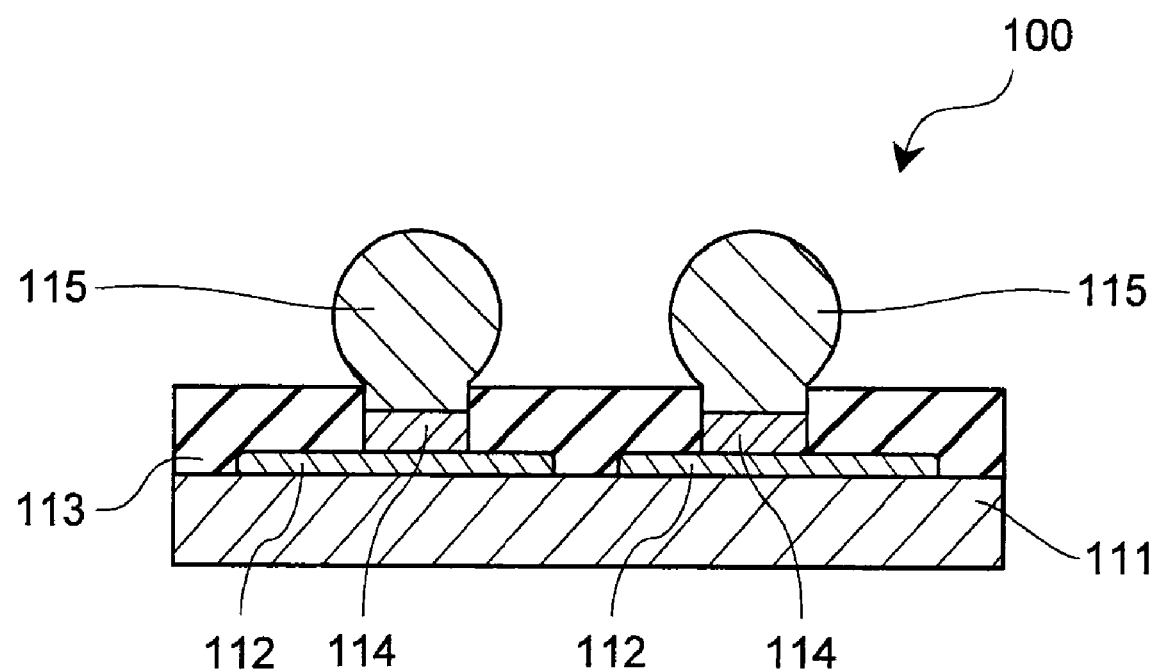
FIG. 11 is a sectional view illustrating the structure of the conventional WLCSP type semiconductor device.
Figure 12:
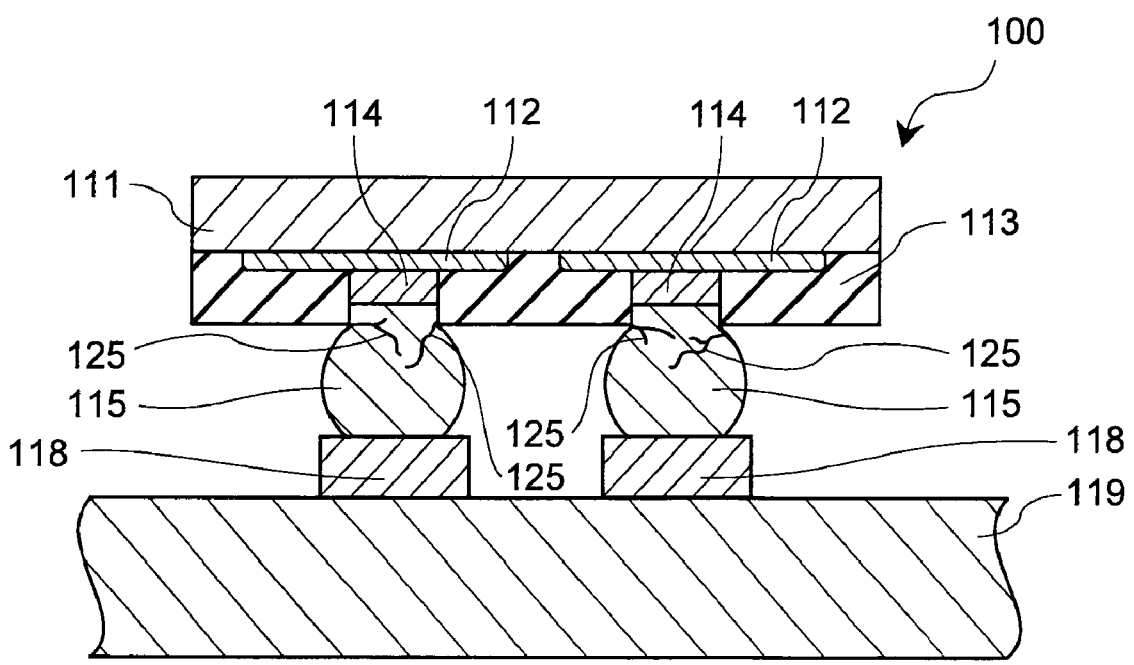
FIG. 12 is a sectional view illustrating the structure of the conventional WLCSP type semiconductor device mounted on a printed circuit board.

FIG. 9 is a sectional view illustrating the structure of a semiconductor device according to a sixth embodiment of the invention. The semiconductor device 6 according to the sixth embodiment of the invention has a silicon substrate 11 that has an integrated circuit portion (not shown) on the top face (one surface) thereof, electrode pads 12 formed on the top face of the silicon substrate 11, a sealing resin layer 13 formed on the top face of the silicon substrate 11, column-shaped metal posts 54 provided on the top faces of the electrode pads 12 with the top faces of the metal posts exposed through the sealing resin layer 13, solder balls 55 formed on the top faces of the metal posts 54, and a low-elasticity resin layer 27 formed on the top face of the sealing resin layer 13 such that part of the low-elasticity resin layer 67 lies between the sealing resin layer 13 and the solder balls 55.

The sixth embodiment of the invention is a modified example of the fifth embodiment, and the low-elasticity resin layer 67 is formed to cover the whole top face of the sealing resin layer 13. In other respects, the structure here is similar to that in the fifth embodiment. Note that the low-elasticity resin layer 67 may be formed not to cover the surface of the metal post 54, so long as it covers at least part of the circumferential part 13a of the sealing resin layer 13 abutting the metal post 54.

Also with the structure of the sixth embodiment shown in FIG. 9, the deformation force acting in a concentrated fashion on the solder ball 55 (in particular to the base part of the solder ball 55 where it is close to the sealing resin layer 13), resulting from temperature change or the like, can be reduced or canceled with the low-elasticity resin layer 67. Thus, it is possible to prevent damage, such as cracking, to or breakage of the solder ball 55.

It is to be understood that the embodiments described above are not meant to limit the present invention, in which many variations and modifications are therefore possible.

In a semiconductor device according to the invention, a low-elasticity resin layer is formed such that part of it lies between the projecting electrode and the sealing resin layer. For the material forming the low-elasticity resin layer, a resin material with an elastic modulus lower than that of the sealing resin layer is used. With this structure, after mounting the semiconductor device according to the invention on an external board such as a printed circuit board, if a difference in the degree of thermal expansion or a difference in the degree of thermal contraction arises between the semiconductor substrate and the external board as a result of temperature change or the like, the deformation force acting in a concentrated fashion on a solder ball (projecting electrode) can be reduced or canceled with the low-elasticity resin layer. Thus, it is possible to prevent damage, such as cracking, to or breakage of the solder ball (projecting electrode).

What is claimed is:

1. A semiconductor device comprising:
a semiconductor substrate;
a sealing resin layer formed on a top face of the semiconductor substrate;
a metal post formed on the top face of the semiconductor substrate such that a top face of the metal post is exposed through the sealing resin layer;
a projecting electrode formed on the top face of the metal post; and
a low-elasticity resin layer made of a resin material with an elasticity modulus lower than an elasticity modulus of the sealing resin layer, the low-elasticity resin layer being formed on the top face of the sealing resin layer such that at least part of the low-elasticity resin layer lies between the projecting electrode and the sealing resin layer.

2. The semiconductor device according to claim 1, wherein the low-elasticity resin layer is formed in a circumferential part of the metal post as seen in a plan view.

3. The semiconductor device according to claim 1, wherein the low-elasticity resin layer covers the whole top face of the sealing resin layer.

4. The semiconductor device according to claim 1, wherein the low-elasticity resin layer is formed of polyimide.

5. The semiconductor device according to claim 1, wherein the projecting electrode is formed of solder.

* * * * *